United States Patent
Latham et al.

(10) Patent No.: US 10,914,797 B2
(45) Date of Patent: Feb. 9, 2021

(54) METHODS AND APPARATUS FOR SENSOR HAVING FAULT TRIP LEVEL SETTING

(71) Applicant: Allegro MicroSystems, LLC, Manchester, NH (US)

(72) Inventors: Alexander Latham, Harvard, MA (US); Stephen Marshall, Concord, NH (US); Aaron Cook, Deerfield, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/127,295

(22) Filed: Sep. 11, 2018

(65) Prior Publication Data

US 2019/0018079 A1 Jan. 17, 2019

Related U.S. Application Data

(63) Continuation of application No. 14/918,716, filed on Oct. 21, 2015, now Pat. No. 10,101,410.

(51) Int. Cl.
*G01R 33/07* (2006.01)
*G01R 33/00* (2006.01)

(52) U.S. Cl.
CPC ......... *G01R 33/07* (2013.01); *G01R 33/0023* (2013.01)

(58) Field of Classification Search
CPC ............... G01R 33/07; G01R 33/0023; G01R 31/2829; G01R 31/024; H02H 1/00; H02P 29/0241
See application file for complete search history.

(56) References Cited

U.S. PATENT DOCUMENTS

| 4,687,622 | A | | 8/1987 | Longden |
| 4,908,527 | A | | 3/1990 | Van Antwerp |
| 5,045,832 | A | | 9/1991 | Tam |
| 5,081,442 | A | * | 1/1992 | Ito .................. B60R 21/0176 340/438 |
| 5,194,766 | A | | 3/1993 | Sugawara |
| 5,339,067 | A | | 8/1994 | Harris et al. |
| 5,493,218 | A | | 2/1996 | Hayashi et al. |
| 5,594,894 | A | | 1/1997 | Mitra |
| 5,621,319 | A | | 4/1997 | Bilotti et al. |
| 6,154,027 | A | | 11/2000 | Alexander et al. |
| 6,275,422 | B1 | | 8/2001 | Javanifard et al. |

(Continued)

FOREIGN PATENT DOCUMENTS

GB 2 107 070 A 4/1983
WO WO 2013/017211 A1 2/2013

OTHER PUBLICATIONS

Allegro Microsystems, Inc. Data Sheets; Nos. A3250 and A3251; Field-Programmable, Chopper-Stabilized Unipolar Hall-Effect Switches; Oct. 15, 2002; 15 Pages.

(Continued)

*Primary Examiner* — Tung X Nguyen
*Assistant Examiner* — Feba Pothen
(74) *Attorney, Agent, or Firm* — Daly Crowley Mofford & Durkee, LLP

(57) ABSTRACT

Methods and apparatus for a sensor having non-ratiometric fault trip level setting. In embodiments, a sensor has a sensing element with a fixed gain. A signal processing module receives the fault trip level setting and maintains the fault trip level setting constant during changes in the supply voltage.

17 Claims, 6 Drawing Sheets

(56) References Cited

U.S. PATENT DOCUMENTS

| | | |
|---|---|---|
| 6,288,567 B1 | 9/2001 | Fink |
| 6,433,976 B1 * | 8/2002 | Phillips .............. G01R 31/1218 |
| | | 361/42 |
| 6,465,289 B1 | 10/2002 | Streit et al. |
| 6,522,131 B1 | 2/2003 | Hiligsmann et al. |
| 6,573,693 B2 | 6/2003 | Okamoto |
| 6,646,566 B1 | 11/2003 | Tanguay |
| 6,870,698 B2 | 3/2005 | Blatchley et al. |
| 6,968,484 B2 | 11/2005 | Hummel |
| 7,103,704 B2 | 9/2006 | Chatterjee |
| 7,184,876 B2 | 2/2007 | Teulings et al. |
| 7,319,418 B2 | 1/2008 | Fink |
| 7,425,821 B2 | 9/2008 | Monreal et al. |
| 7,495,555 B2 | 2/2009 | Seal et al. |
| 7,518,354 B2 | 4/2009 | Stauth et al. |
| 7,552,016 B2 | 6/2009 | Vig et al. |
| 7,573,393 B2 | 8/2009 | Haas et al. |
| 7,659,716 B2 | 2/2010 | Nishikawa |
| 7,923,996 B2 | 4/2011 | Doogue et al. |
| 8,564,285 B2 | 10/2013 | Romero et al. |
| 8,957,676 B2 | 2/2015 | David et al. |
| 2007/0024372 A1 | 2/2007 | Hagen |
| 2008/0231286 A1 * | 9/2008 | Tsunekazu ........... G01R 31/024 |
| | | 324/509 |
| 2008/0260137 A1 | 10/2008 | Poi et al. |
| 2009/0009164 A1 | 1/2009 | Utsuno |
| 2009/0079411 A1 | 3/2009 | Ariyama |
| 2009/0295368 A1 | 12/2009 | Doogue et al. |
| 2010/0001704 A1 | 1/2010 | Williams |
| 2010/0013461 A1 | 1/2010 | Masubuchi et al. |
| 2010/0125344 A1 | 5/2010 | Gaub et al. |
| 2010/0127700 A1 | 5/2010 | Sugiura |
| 2010/0207621 A1 | 8/2010 | Yano |
| 2010/0211347 A1 | 8/2010 | Friedrich et al. |
| 2010/0237890 A1 | 9/2010 | Motz et al. |
| 2010/0308815 A1 | 12/2010 | Muraoka et al. |
| 2013/0293405 A1 | 11/2013 | Medina Sanchez-Castro |
| 2014/0184200 A1 | 7/2014 | Milano et al. |
| 2014/0266426 A1 | 9/2014 | Vinayak |
| 2015/0358724 A1 | 12/2015 | Petkov et al. |
| 2017/0115362 A1 | 4/2017 | Latham et al. |

OTHER PUBLICATIONS

PCT Search Report and Written Opinion of the ISA for PCT Pat. App. No. PCT/2012/032693; dated Jun. 18, 2012; 12 pages.

PCT International Preliminary Report on Patentability dated Nov. 21, 2013; for PCT Pat. App. No. PCT/US2012/032693; 10 pages.

English translation of German PTO Office Action dated Apr. 6, 2017 for DE Pat. Appl. No. 112012001994.6; 9 pages.

Amended Claims from German Pat. Appl. No. 112012001994.6 filed Aug. 11, 2017; 5 pages.

U.S. Non-Final Office Action dated Jul. 19, 2017 for U.S. Appl. No. 14/918,716; 16 Pages.

Response to U.S. Non-Final Office Action dated Jul. 19, 2017 for U.S. Appl. No. 14/918,716; Response filed Oct. 16, 2017; 11 Pages.

U.S. Final Office Action dated Feb. 2, 2018 for U.S. Appl. No. 14/918,716; 7 Pages.

Response to U.S. Final Office Action dated Feb. 2, 2018 for U.S. Appl. No. 14/918,716; Response filed Apr. 10, 2018; 10 Pages.

U.S. Notice of Allowance dated Jun. 12, 2018 for U.S. Appl. No. 14/918,716; 8 Pages.

U.S. Non-Final Office Action ($1^{st}$) dated Jul. 8, 2013 for U.S. Appl. No. 13/102,449; 21 Pages.

Response to U.S. Non-Final Office Action dated Jul. 8, 2013 for U.S. Appl. No. 13/102,449; Response filed Nov. 8, 2013; 13 Pages.

U.S. Non-Final Office Action ($2^{nd}$) dated Feb. 27, 2014 for U.S. Appl. No. 13/102,449; 26 Pages.

Response to U.S. Non-Final Office Action ($2^{nd}$) dated Feb. 27, 2014 for U.S. Appl. No. 13/102,449; Response filed Jun. 25, 2014; 8 Pages.

U.S. Final Office Action dated Jul. 18, 2014 for U.S. Appl. No. 13/102,449; 19 Pages.

Response to U.S. Final Office Action dated Jul. 18, 2014 for U.S. Appl. No. 13/102,449; Response filed Oct. 20, 2014; 7 Pages.

U.S. Notice of Allowance dated Nov. 18, 2014 for U.S. Appl. No. 13/102,449; 10 Pages.

Intention of Grant with English Allowed Claims dated Mar. 9, 2020 for German Application No. 112012001994.6; 10 Pages.

* cited by examiner

METHODS AND APPARATUS FOR SENSOR HAVING FAULT TRIP LEVEL SETTING

CROSS REFERENCE TO RELATED APPLICATIONS

The present application is a continuation of U.S. patent application Ser. No. 14/918,716, filed on Oct. 21, 2015, which is incorporated herein by reference.

BACKGROUND

As is known, a wide variety of sensors are used for a wide range of applications. Conventional magnetic field sensors, for example, can include a fault set point that can be set by a user, such as with a resistor divider network coupled to a supply voltage. In typical configurations, there is a ratiometric relationship between the supply voltage and the sensor output so that changes in the supply voltage level ripple throughout the sensor functionality, such that the trip point field level does not change as the supply voltage changes. In addition, regulated voltages can vary, especially in noisy and/or extreme environments. Further, a supply voltage from a battery will have inherent changes in voltage level over time. Also, some systems may have separate circuit boards providing supply voltage signals that can vary.

It will be appreciated that in many applications constant sensor sensitivity is desirable so that supply voltage changes do not impact performance. Known sensors typically have one or more fault trip points that are ratiometric with respect to a supply voltage, e.g., Vcc. A user sets a trip point voltage with a resistor divider network from Vcc. The voltage at the resistor divider moves with Vcc so as to vary the trip level setting.

SUMMARY

The present invention provides method and apparatus for sensors having one or more non-ratiometric fault set points. As used herein, non-ratiometric means not ratiometric to a supply voltage, e.g., Vcc. In embodiments, a sensor has a fixed gain signal path where the user is able to set a constant fault trip point using external resistors, for example.

In embodiments, a sensor includes a circuit having a divider network to provide a voltage to an ADC, which has a Vcc-based reference, to output a digitized signal. The circuit further includes a signal processing module that receives the digitized signal and generates a code for a DAC, which uses the same reference as the signal path. This effectively takes a ratiometric voltage and converts it to a fixed output on the DAC, independent of Vcc. This enables fault trip point setting that does not respond to changes in supply voltage, i.e., non-ratiometric.

In one aspect of the invention, a sensor comprises: a sensing element having a fixed gain; a voltage pin to receive a supply voltage; a fault trip level pin to receive a fault trip level setting; a signal processing module to receive the fault trip level setting and maintain the fault trip level setting constant during changes in the supply voltage; a fault output pin to transition to an active state based a signal from the sensing element and the fault trip level setting output from the signal processing module; and a sensor output pin to output data from the sensing element.

The sensor can include one or more of the following features: an ADC coupled to the fault trip level pin and a DAC, wherein the signal processing module is coupled between the ADC and the DAC, the ADC is referenced to a voltage that is the same as a voltage on the fault trip level pin, the ADC-referenced voltage comprises the supply voltage, a bandgap coupled to a current source to drive the sensing element with a constant current and coupled to the DAC, the sensing element comprises a Hall plate, the sensing element is configured to have a reference voltage to maintain the fixed gain, the sensing element comprises a magnetic field sensing element, the sensing element to sensor output pin path has a fixed gain which is not ratiometric to the supply voltage, the fault trip level pin is coupled only to components consisting of resistors and/or capacitors, the resistors and/or capacitors are connected between the supply voltage and ground, and/or the fault trip level setting is not set with a regulated voltage or current.

In another aspect of the invention, a method comprises: employing a sensing element having a fixed gain; employing a voltage pin to receive a supply voltage; employing a fault trip level pin to receive a fault trip level setting; employing a signal processing module to receive the fault trip level setting and maintain the fault trip level setting constant during changes in the supply voltage; employing a fault output pin to transition to an active state based a signal from the sensing element and the fault trip level setting output from the signal processing module; and employing a sensor output pin to output data from the sensing element.

The method can further include one or more of the following features: setting the fault trip level setting using a resistor divider coupled to the supply voltage, setting the fault trip level setting using a resistor tied from the fault trip level pin to the supply voltage or to ground, employing a constant current source for setting the fault trip level setting, employing at least one capacitor at the fault trip level pin to provide an anti-aliasing filter, the fault output pin is coupled to an open-drain device, employing an ADC coupled to the fault trip level pin and a DAC, wherein the signal processing module is coupled between the ADC and the DAC, the ADC is referenced to a voltage that is the same as a voltage on the fault trip level pin, the ADC-referenced voltage comprises the supply voltage, a bandgap reference coupled to a current source to drive the sensing element with a constant current and coupled to the DAC, the sensing element comprises a magnetic field sensing element, the sensing element to sensor output pin path has a fixed gain which is not ratiometric to the supply voltage, the fault trip level setting is not set with a regulated voltage or current, the signal processing module scales codes from the ADC and generates codes for the DAC to provide a desired trip level transfer function, the transfer function is linear, the transfer function is selected from the group consisting of linear, square, and logarithmic, the transfer function, for a range of ADC codes, provides the same DAC code, the signal processing module corrects for gains and/or offsets between a signal path, the ADC, the DAC, and/or the comparator, and/or the signal processing module corrects for temperature.

BRIEF DESCRIPTION OF THE DRAWINGS

The foregoing features of this invention, as well as the invention itself, may be more fully understood from the following description of the drawings in which.

DETAILED DESCRIPTION

Figure 1:
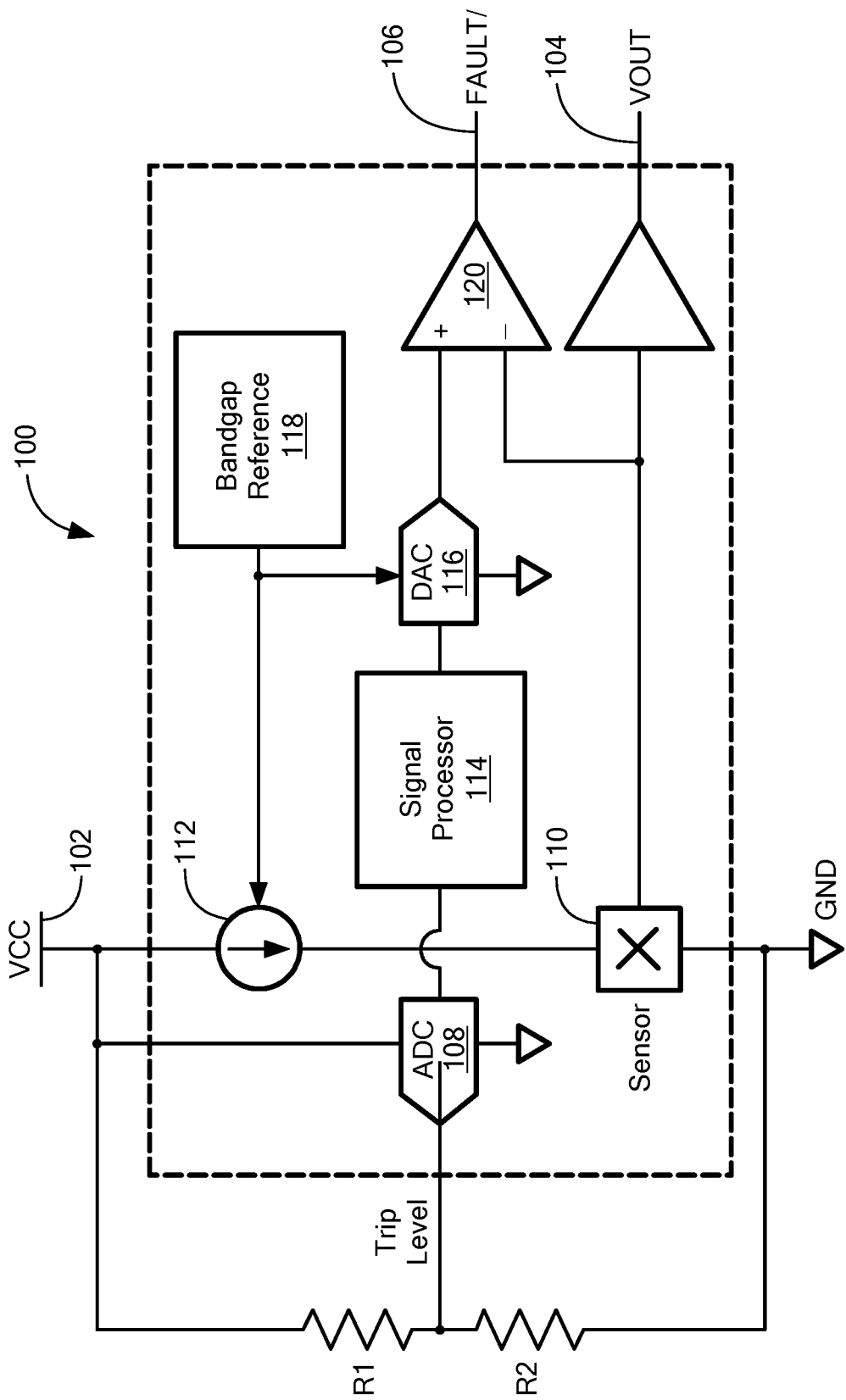
FIG. 1 is a schematic representation of a sensor having non-ratiometric fault level setting.

As used herein, the term "magnetic field sensor" is used to describe a circuit, which can be provided in an IC package, that uses a magnetic field sensing element(s), generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

In many applications it is preferable to have a component with high power supply rejection ratio (PSRR). By definition, a ratiometric part does not provide a high PSRR. The power supply rejection ratio (PSRR) refers to the amount of noise from a power supply that a particular device can reject, i.e., the ratio of the change in supply voltage in an amplifier to the equivalent (differential) output voltage it produces. An ideal circuit has infinite PSRR.

In general, embodiments of the invention relate to sensors having fixed gain signal path (not ratiometric to Vcc) where the user is able to set a fault trip point, such as by using external resistors. For conventional sensors which are ratiometric, the user can set a fault trip point voltage by resistor dividing from Vcc. This voltage moves with Vcc in the same way the signal path gain changes, thus keeping the fault trip point constant versus Vcc. However, where the signal gain is constant, i.e., does not change with Vcc, a change in Vcc causes a change in the fault trip point. In embodiments, a fault trip level voltage from the resistor divider is provided to an ADC with a Vcc based reference. The digitized signal is processed to generate a code for a DAC that uses the same (bandgap based) reference as the signal path to effectively take a ratiometric voltage and convert it to a fixed output on the DAC that is independent of Vcc. In other embodiments, a fault trip point is with a resistor to ground on the fault level set pin. A current is driven into the resistor to create the trip voltage. The current is based on the same reference (bandgap based for example) as the signal path.

Embodiments of the invention provide a sensor having a non-ratiometric signal path and relatively constant fault trip point set with external resistors, for example. The advantages of this arrangement include simplicity as compared to forcing a user to supply a fixed voltage to the sensor or program the trip point. In addition, embodiments of the invention provide a sensor that one can trim out error in the fault level by changing the conversion of the information from the user to the analog signal path. In particular, in embodiments using an ADC and a DAC, one can add digital trim to the fault in a straightforward manner.

FIG. 1 shows an illustrative a sensor 100 coupled to a supply voltage (Vcc) 102 for providing a sensor output 104 and a fault output 106. In general, the sensor has a dynamic reference voltage referred to as a trip point that determines the level at which a voltage causes the fault output 106 to change states.

The supply voltage 102 is coupled to an ADC 108 and to a resistor divider network having first and second resistors R1, R2, which provide the fault trip level voltage to the ADC 108. A sensing element 110, such as a magnetic field sensing element, e.g., a Hall Effect element, is coupled to the supply voltage 102 via a current source 112 for biasing the element to a constant gain. The output of the sensing element 110 provides the sensor output 104.

A signal processing module 114 processes the signal from the ADC 108, as described more fully below, and provides a digital signal to a DAC 116, which is coupled to a bandgap reference 118. The current source 112 is also coupled to the bandgap reference 118. The outputs of the sensing element 110 and the DAC 116, are combined, such as by a comparator 120, to generate the fault output 106 signal.

The ADC 108 converts the analog voltage signal (trip level) from the R1/R2 divider network to a digital word based on the divided supply voltage 102 with a reference to the supply voltage. Digital correction is then applied to the fault trip level by the signal processing module 114, which provides an output word that is then converted back to analog by the DAC 116, which has a reference signal from the bandgap reference module 118.

In the illustrated embodiment, the sensing element 110 is provided as a Hall plate having a constant gain that is controlled by the current from the current source 112 driven through the Hall plate. The bandgap reference 118, which can be provided as any suitable reference, maintains a constant current through the Hall plate, and thus, maintaining a constant gain. It is understood that a bandgap reference refers to a common circuit on ICs that provides a stable voltage over temperature (and Vcc) based on the physics of the semiconductors used.

In embodiments, a user can set the trip level to the ADC 108 by selecting impedance values for the resistors R1, R2 in the divider network coupled to Vcc 102. If the current through the Hall plate 110 was dependent on Vcc, then one could bring the trip level voltage into a comparator. In embodiments of the invention, the trip level voltage is provided to the ADC 108, which has a Vcc based reference. The signal processing module 114 performs digital scaling and trimming (if needed, as one could go straight from the ADC to the DAC) for the trip point and outputs a value to the DAC 116, which has a bandgap based reference 118. The DAC 116 output is compared 120 to the sensor 110 output to determine whether the fault pin 106 should be active. This arrangement maintains the fault trip point constant as Vcc changes and as the bandgap reference changes (which should be relatively little). As long as the current into the Hall plate 110 and the voltage reference of the DAC are referenced to the same voltage (even this voltage moves), then the fault trip point will not change. That is, fault sensitivity remains substantially constant.

The signal processing module 114 can provide digital correction for various offsets including supply voltage offset, DAC output offset, comparator offset, amplifier offset, gain error offset, and the like. In addition, these offset errors can also have a temperature component that can be corrected.

Figure 2:
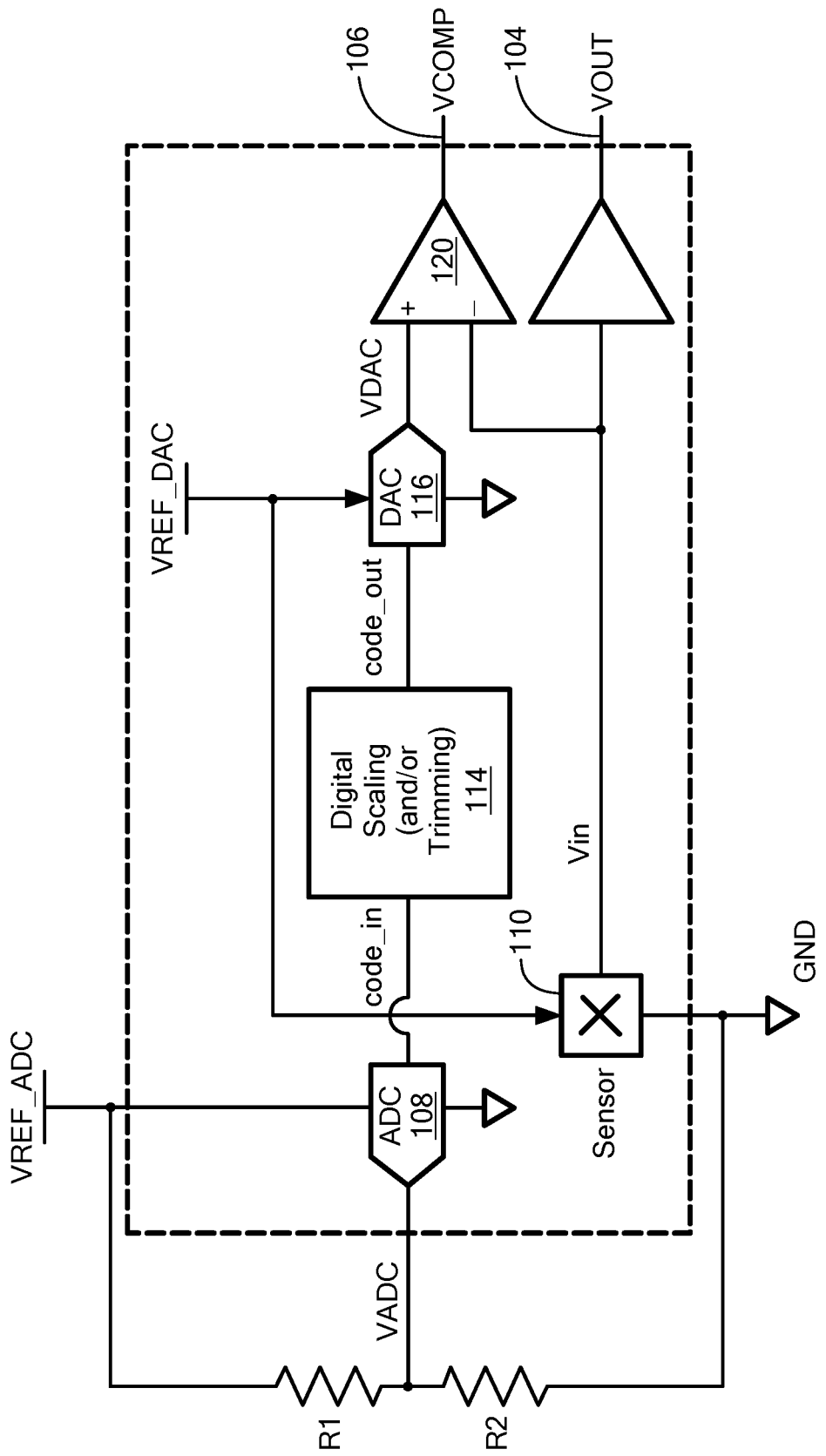
FIG. 2 is a schematic representation showing further detail for the sensor of FIG. 1.

FIG. 2 has some commonality with the circuit of FIG. 1 where like reference numbers indicate like elements with some additional detail for digital correction. Voltage VADC, which is the fault set point, is generated by the resistor divider network, VREF_ADC is a supply voltage to the ADC 108, and VREF_DAC is a supply voltage to the DAC 116. VREF_DAC also provides a constant bias current to the Hall plate 110 for a constant gain.

The voltage VADC from the resistor divider network can be defined as:

$$VADC = VREF_{ADC}\frac{R2}{R1+R2}$$

The digital output of the ADC 108 can be defined as:

$$\text{code\_in} = \frac{VADC}{VREF_{ADC}}(2^N - 1) = \frac{R2(2^N - 1)}{R1 + R2}$$

where N refers to the number of bits for the ADC. Note that code_in is independent of VREF_ADC.

The output of the sensing element 110 can be referred to as Vin and defined as:

$$Vin = K \times B \times VREF_{DAC}$$

where B is the field, current, etc., being sensed and K is a constant gain for the sensor. Note that Vin and VDAC depend on VREF_DAC, which controls the gain of the sensing element 110 and DAC 116.

The DAC 116 output VDAC can be defined as:

$$VDAC = \text{code\_out}\frac{VREF_{DAC}}{(2^M - 1)}$$

where code_out is the digital output of the signal processing module 114 that performs the corrections.

As can be seen, the comparator 120 trips when Vin equals VDAC (VDAC=Vin). From above, it follows that $$VDAC = \text{code\_out}\frac{VREF_{DAC}}{2^M - 1} = K \times B_{trip} \times VREF_{ADC} \text{ where}$$

$$B_{trip} = \frac{\text{code\_out}}{K(2^M - 1)}.$$

Note that the trip level (B_trip) depends only on code_out, which is described more fully below, the remaining values are fixed.

It is understood that the correction processing performed by the signal processing module 114 can be customized. In an ideal case, B_trip does not change as VREF_ADC (or VREF_DAC) change. In embodiments, each percentage of VREF_ADC set by the user causes a trip level at a given B value.

It should be noted that the gain of a magnetic sensor is usually dependent on a reference voltage.

For Hall Effect sensors, the reference voltage fixes a current through the Hall plate to control gain. For a GMR sensing element, a current through a single GMR or a voltage on a Wheatstone bridge controls the gain.

While the conversion from code_in to code_out can be determined in a variety of ways, in embodiments, the conversion includes offset and slope adjustment. For example, in one particular embodiment, the ADC input is set to be between 0.3 and 0.7 times VREF_ADC. The resulting trip level is 50% to 125% of the full scale output. Based on the gain (K) of the sensing element, this determines the minimum and maximum for the DAC. For the ADC, the code_in min is 0.3*(2^N−1), and the code_in max is 0.7*(2^N−1), for example. In illustrative embodiments, for the DAC, the code_out min and max are determined as set forth below, setting Btrip to the min and max levels.

Figure 3:
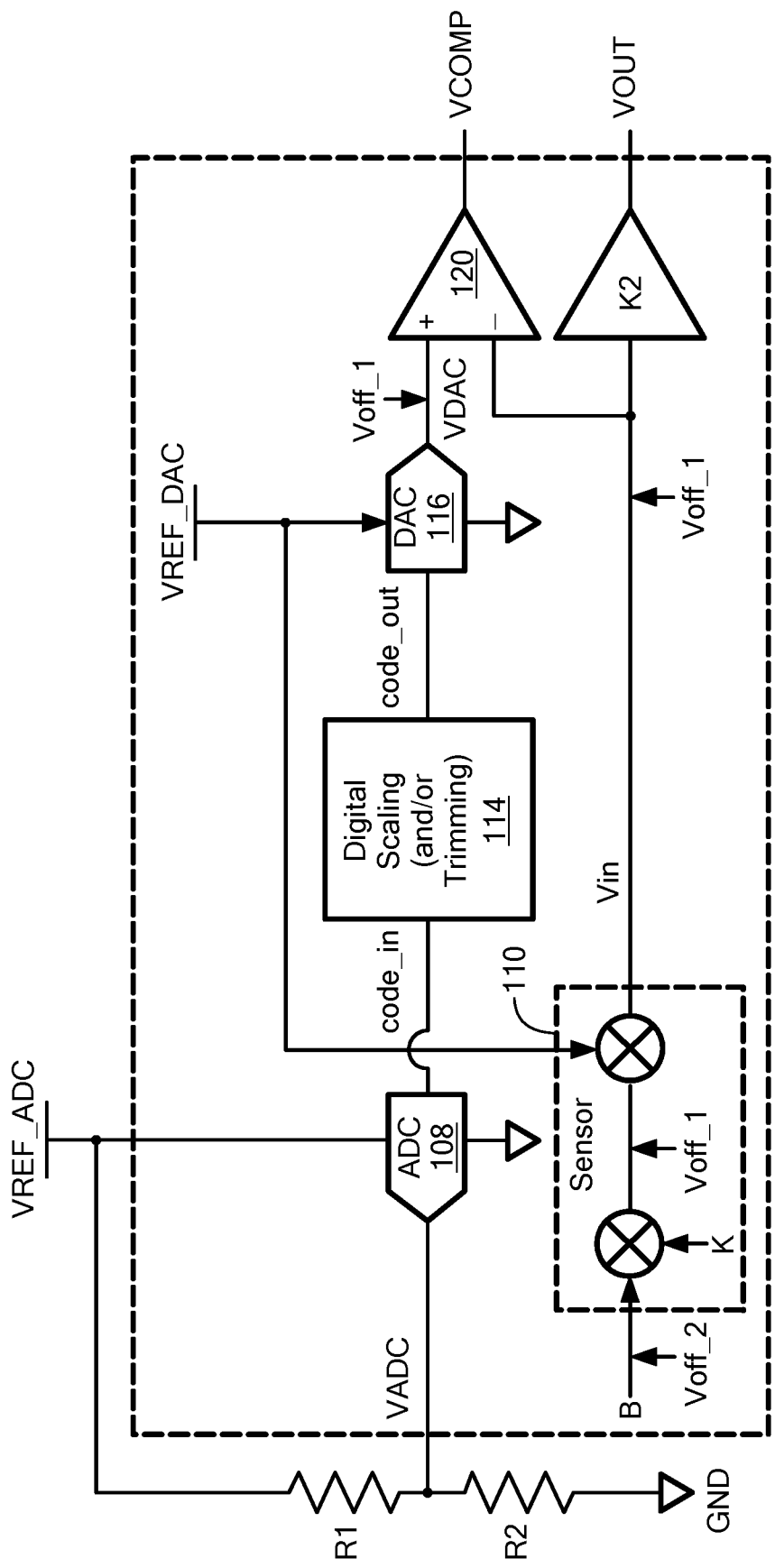
FIG. 3 is a schematic representation showing further detail for the sensor of FIG. 2.

Referring to FIG. 3, from above:

$$\text{code}_{in} = \frac{R2(2^N - 1)}{R1 + R2}$$

and $$\text{code}_{out} = B_{trip} \times K(2^M - 1)$$

Using minimum and maximums:

$$\text{code}_{out} = \left[(\text{code}_{in} - \text{code}_{in(MIN)})\left(\frac{\text{code}_{out(MAX)} - \text{code}_{out(MIN)}}{\text{code}_{in(MAX)} - \text{code}_{in(MIN)}}\right) + \text{code}_{out(MIN)}\right]$$

If K or K2 (amplifier gain) is slightly off or separate but fixed references for the DAC and sensor are used, it effectively shows up as K being incorrect in the above. This can be avoided by trimming K and setting K2 using matched resistors. To compensate for K being off, the below can be computed noting that one can change gain_adj with temperature if necessary by adding a temperature sensor to the system.

$$\text{code}_{out} = \left[(\text{code}_{in} - \text{code}_{in(MIN)})\left(\frac{\text{code}_{out(MAX)} - \text{code}_{out(MIN)}}{\text{code}_{in(MAX)} - \text{code}_{in(MIN)}}\right) \times \text{gain}_{adj} + \text{code}_{out(MIN)} \times \text{gain}_{adj}\right]$$

If there is offset in the comparator 120 or signal path after the sensing element 110, this offset can be corrected per below noting that this performs best by fixing VREF_DAC. If VREF_DAC changes, only the offset which is multiplied by VREF_DAC will be perfectly cancelled.

$$\text{code}_{out} = \left[(\text{code}_{in} - \text{code}_{in(MIN)})\left(\frac{\text{code}_{out(MAX)} - \text{code}_{out(MIN)}}{\text{code}_{in(MAX)} - \text{code}_{in(MIN)}}\right) \times \text{gain}_{adj} + \text{code}_{out(MIN)} \times \text{gain}_{adj}\right] + c_{off}$$

If there is offset in the sensing element 110, this offset can be corrected by (voff_2 in FIG. 3) per below:

$$\text{code}_{out} = \left[(\text{code}_{in} - \text{code}_{in(MIN)})\left(\frac{\text{code}_{out(MAX)} - \text{code}_{out(MIN)}}{\text{code}_{in(MAX)} - \text{code}_{in(MIN)}}\right) \times \text{gain}_{adj} + \text{code}_{out(MIN)} \times \text{gain}_{adj}\right] + c_{off} + \text{gain}_{adj} \times c_{off2}$$

It is understood that $c_{off}$ (equations) and $v_{off}$ (circuit) are proportional to each other. In embodiments, a correspondence is the number of codes that are needed to compensate for how many volts, which depends upon gain values in the system.

Figure 4:
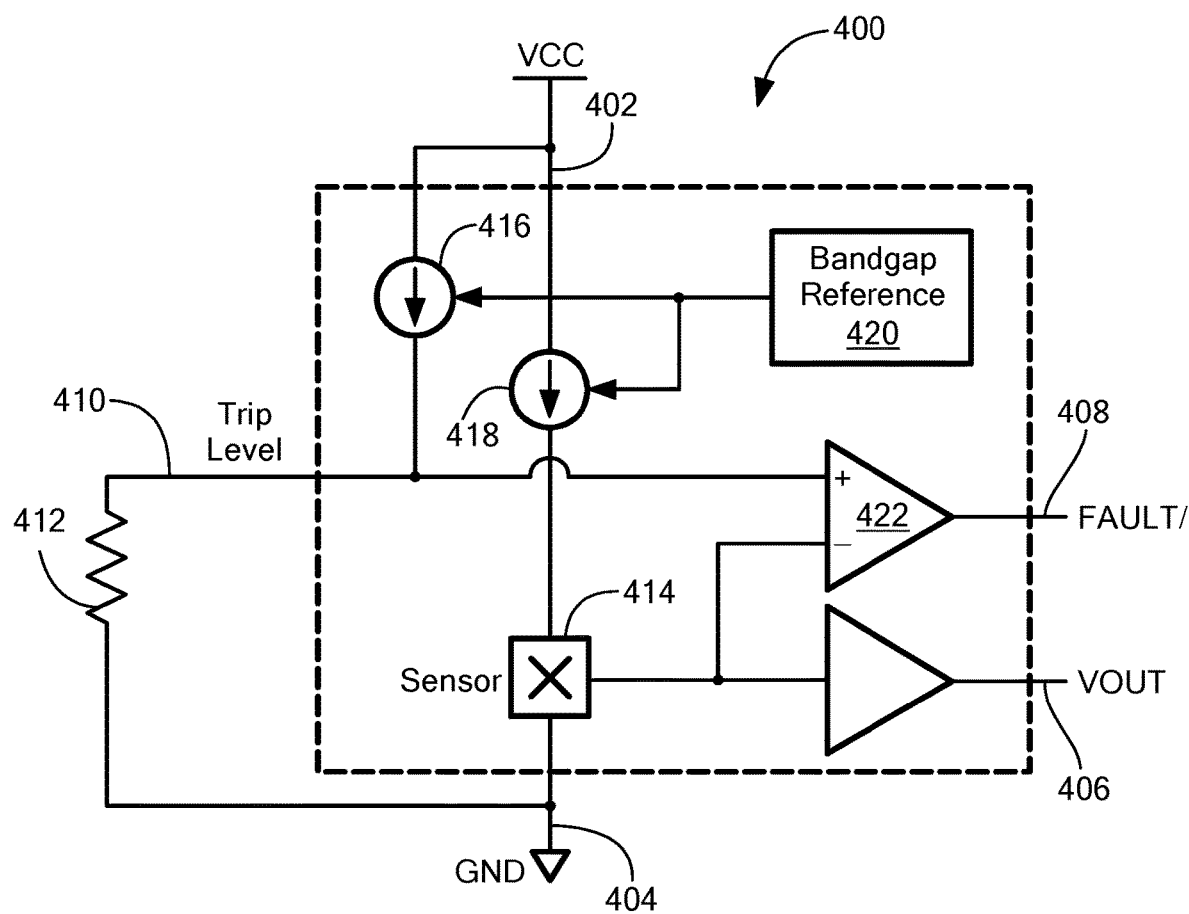
FIG. 4 is a schematic representation of a further sensor having non-ratiometric fault level setting.

FIG. 4 shows a sensor 400 having an input pin 402 for receiving a supply voltage and a ground pin 404 for connecting to ground. The sensor 400 includes an output pin 406 to provide a sensor output voltage VOUT and a fault output pin 408 to provide a fault output signal FAULT/. A trip level pin 410 can be coupled to a resistor 412. The sensor 400 includes a sensing element 414 that provides the output signal VOUT.

The supply voltage input pin 402 is coupled to first and second current sources 416, 418, which are coupled to a bandgap reference 420. The output of the first current source 416 is coupled to the trip level pin 410 and a comparator 422 input. The output of the second current source 418 is coupled to the sensing element 414, the output of which is coupled to an input of the comparator 422.

In the illustrated embodiment, the user sets the fault trip level using the single resistor 412 connected to ground. The first current source 416 into the resistor 412 is based off of the same reference 420 as the gain control for the sensing element 414. In the illustrated embodiment, the sensing element 414 comprises a Hall plate with a current drive 418. The ratio of the first and second current sources 416, 418 sets the gain from the trip level setting 410 to the sensing element 414. Voltages can be added/subtracted based on the reference in order to shift the offset between the two trip levels into the comparator.

In the illustrated embodiment at zero resistance, the comparator 422 trips at zero field from sensor element 414. In embodiments, there is a linear relationship of resistance to field trip level. By adding a constant voltage to either side of the comparator 422, one shifts the y intercept—meaning one can create any desired y=mx+b relationship. Here, y is the trip level, and x is the resistance.

Figure 5:
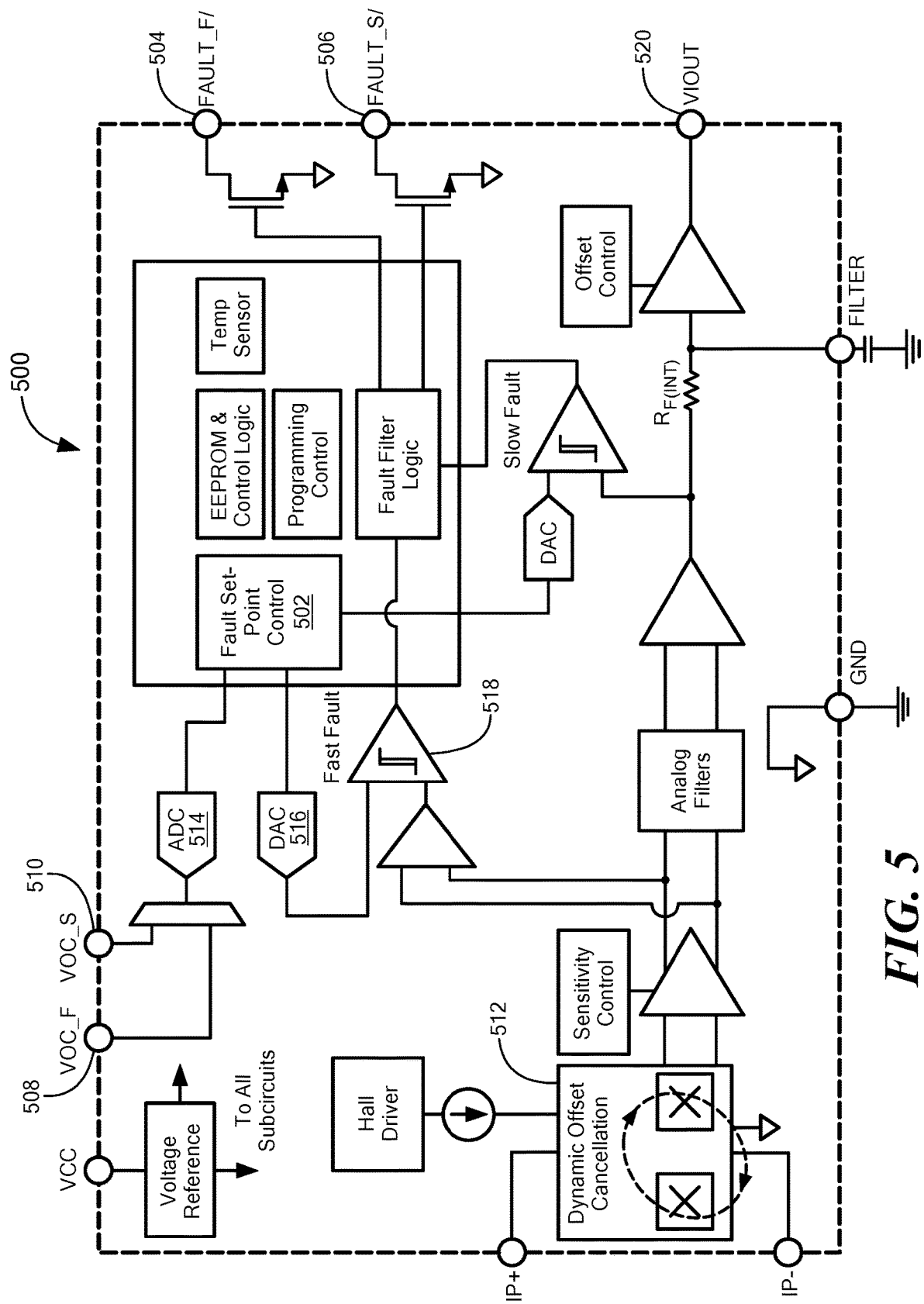
FIG. 5 is a schematic representation of a current sensor having non-ratiometric fault level setting.

FIG. 5 shows an illustrative current sensor 500 having a non-ratiometric fault trip level module 502. In one embodiment, the sensor 500 includes first and second fault outputs 504, 506. Trip level input pins 508, 510 are provided to which divider networks can be coupled to set trip levels in conjunction with a supply voltage, as described above. The sensor 500 includes a Hall Effect sensor module 512 for providing a sensor output voltage 520. Field is generated on the Hall Effect sensor module 512 by current flowing through IP+ to IP−, resulting in an output signal which is proportional to the current flow. An ADC module 514 is coupled to the VOC pin and to the fault trip level module 502, which generates an output that is converted by a DAC 516. The signal from the Hall Effect sensor module 512 is compared 518 to the signal from the DAC 516. In the illustrated embodiment, a 'fast' fault 504 and a 'slow' fault 506 are provided.

While illustrative embodiments of the invention are primarily shown and described in conjunction with magnetic field sensing elements, such as Hall effect sensors, it understood that embodiments of the invention are applicable to sensors and sensing elements in general in which it is desirable to have non-ratiometric fault trip points for fixed gain sensing elements.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Figure 6:
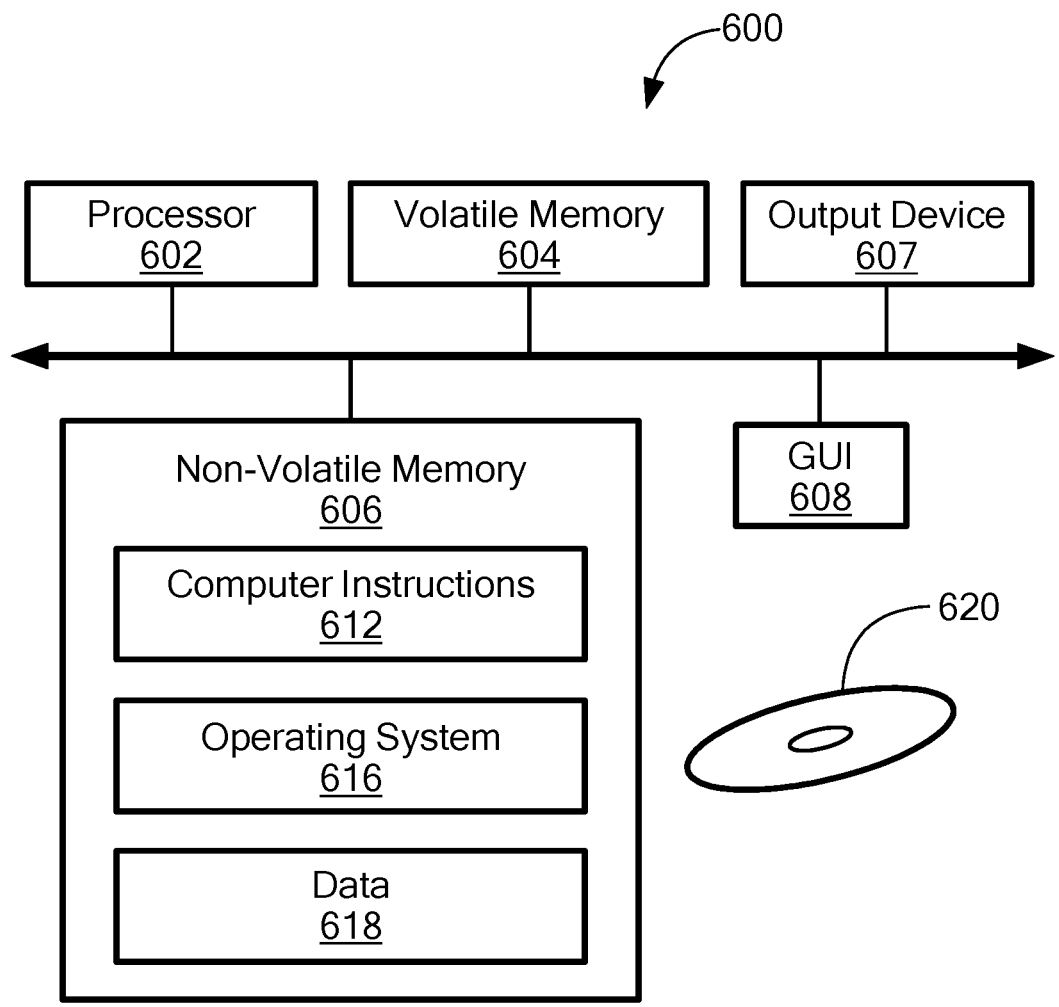
FIG. 6 is a schematic representation of an illustrative computer that can perform at least a portion of the processing described herein.

FIG. 6 shows an exemplary computer 600 that can perform at least part of the processing described herein. The computer 600 includes a processor 602, a volatile memory 604, a non-volatile memory 606 (e.g., hard disk), an output device 607 and a graphical user interface (GUI) 608 (e.g., a mouse, a keyboard, a display, for example). The non-volatile memory 606 stores computer instructions 612, an operating system 616 and data 618. In one example, the computer instructions 612 are executed by the processor 602 out of volatile memory 604. In one embodiment, an article 620 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

The invention claimed is:

1. A sensor IC package, comprising:
a sensing element comprising a magnetic field sensing element to sense an external magnetic field;
a voltage pin to receive a supply voltage to energize the sensor IC package;
a fault trip level pin of the IC package configured to receive a fault trip level setting of the IC package, wherein the fault trip level pin is coupled to a reference signal and configured for coupling to a first resistor to form a series circuit path comprising, in order, the reference signal, the fault trip level pin and the first resistor;
a fault output pin of the IC package to selectively transition to an active state based on a comparison of a signal from the sensing element and a voltage on the fault trip level pin; and
a sensor output pin of the IC package to output data from the sensing element.

2. The sensor according to claim 1, wherein the reference signal is referenced to ground.

3. The sensor according to claim 1, wherein the reference signal is referenced to a level other than ground.

4. The sensor according to claim 1, further including a current source for generating the reference signal as a current level.

5. The sensor according to claim 1, further including a voltage source for generating the reference signal as a voltage level.

6. The sensor according to claim 1, further including a comparison circuit to compare the signal from the sensing element and the voltage on the fault trip level pin.

7. The sensor according to claim 6, wherein the comparison circuit comprises a comparator.

8. A method, comprising:
employing a sensing element forming a part of a sensor IC package, wherein the sensing element comprises a magnetic field sensing element to sense an external magnetic field;
employing a voltage pin to receive a supply voltage to energize the sensor IC package;
employing a fault trip level pin of the IC package configured to receive a fault trip level setting of the IC package, wherein the fault trip level pin is coupled to a reference signal and configured for coupling to a first resistor to form a series circuit path comprising, in order, the reference signal, the fault trip level pin and the first resistor;
employing a fault output pin of the IC package to selectively transition to an active state based on a comparison of a signal from the sensing element and a voltage on the fault trip level pin; and
employing a sensor output pin of the IC package to output data from the sensing element.

9. The method according to claim 8, wherein the reference signal is referenced to ground.

10. The method according to claim 8, wherein the reference signal is referenced to a level other than ground.

11. The method according to claim 8, further including employing a current source for generating the reference signal as a current level.

12. The method according to claim 8, further including employing a voltage source for generating the reference signal as a voltage level.

13. The method according to claim 8, further including employing a comparison circuit to compare the signal from the sensing element and the voltage on the fault trip level pin.

14. The method according to claim 13, wherein the comparison circuit comprises a comparator.

15. The sensor according to claim 1, wherein the sensing element comprises a magnetic field sensing element.

16. The sensor according to claim 1, wherein there is a linear relationship of resistance of the first resistor and the fault trip level setting.

17. The sensor according to claim 16, wherein the sensor provides a y=mx+b relationship where y corresponds to the fault trip level setting and x corresponds to the resistance of the first resistor and m corresponds to slope.

* * * * *